United States Patent
King et al.

(10) Patent No.: US 12,040,028 B2
(45) Date of Patent: Jul. 16, 2024

(54) LOW VOLTAGE ONE-TIME-PROGRAMMABLE MEMORY AND ARRAY THEREOF

(71) Applicant: NATIONAL TSING HUA UNIVERSITY, Hsinchu (TW)

(72) Inventors: Ya-Chin King, Hsinchu (TW); Chrong-Jung Lin, Hsinchu (TW); Yao-Hung Huang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 241 days.

(21) Appl. No.: 17/813,046

(22) Filed: Jul. 18, 2022

(65) Prior Publication Data

US 2023/0343403 A1 Oct. 26, 2023

(30) Foreign Application Priority Data

Apr. 22, 2022 (TW) .................................. 111115503

(51) Int. Cl.
| | |
|---|---|
| *G11C 17/00* | (2006.01) |
| *G11C 17/16* | (2006.01) |
| *H01L 23/522* | (2006.01) |
| *H01L 23/525* | (2006.01) |
| *H10B 20/20* | (2023.01) |

(52) U.S. Cl.
CPC .......... *G11C 17/16* (2013.01); *H01L 23/5226* (2013.01); *H01L 23/5256* (2013.01); *H10B 20/20* (2023.02)

(58) Field of Classification Search
CPC ..... G11C 17/16; H10B 20/20; H01L 23/5226; H01L 23/5256

USPC .......................................................... 365/96
See application file for complete search history.

(56) References Cited

U.S. PATENT DOCUMENTS

| | | | | | |
|---|---|---|---|---|---|
| 6,147,912 | A * | 11/2000 | Kitazawa | ............... | G11C 16/28 365/205 |
| 6,897,543 | B1 * | 5/2005 | Huang | ................... | G11C 17/16 257/E21.666 |
| 8,105,886 | B2 * | 1/2012 | Otsuka | ................ | H01L 23/5256 438/467 |
| 8,541,866 | B2 * | 9/2013 | Katsumata | ............. | H10B 20/20 257/314 |
| 8,653,624 | B2 * | 2/2014 | Hennesthal | ......... | H01L 23/5256 257/529 |
| 8,760,955 | B2 * | 6/2014 | Liao | ....................... | G11C 17/18 365/187 |
| 9,263,389 | B2 * | 2/2016 | Lin | .................... | H01L 23/53295 |
| 9,287,211 | B2 * | 3/2016 | Kurz | .................... | H01L 23/5256 |
| 9,368,445 | B2 * | 6/2016 | Choi | ................... | H01L 23/53295 |

(Continued)

*Primary Examiner* — Viet Q Nguyen
(74) *Attorney, Agent, or Firm* — CKC & Partners Co., LLC (57) ABSTRACT

A low voltage one-time-programmable memory includes a first conductive layer, a first via, a second conductive layer, a select transistor, a second via and a third conductive layer. The first via is electrically connected to the first conductive layer. The second conductive layer is electrically connected to the first via. The select transistor is electrically connected to the second conductive layer. The second via is electrically connected to the second conductive layer. The third conductive layer is electrically connected to the second via. A first current passed through the second via is a sum of a second current passed through the first via and a third current passed through the select transistor.

10 Claims, 5 Drawing Sheets

(56) References Cited

U.S. PATENT DOCUMENTS

| | | | | |
|---|---|---|---|---|
| 10,229,920 B1* | 3/2019 | Cheng | ............... | H01L 29/7802 |
| 10,403,380 B2* | 9/2019 | Takaoka | ............... | H01L 23/5252 |
| 10,878,928 B2* | 12/2020 | Chuang | ............... | G11C 17/165 |
| 11,176,969 B2* | 11/2021 | Chang | ............... | H10B 20/20 |
| 11,257,750 B2* | 2/2022 | Li | ............... | H01L 23/5226 |
| 2008/0316791 A1* | 12/2008 | Yang | ............... | H10B 20/20 |
| | | | | 257/E21.666 |
| 2016/0104712 A1* | 4/2016 | Hsu | ............... | H10B 10/18 |
| | | | | 257/656 |
| 2023/0157009 A1* | 5/2023 | Wu | ............... | G11C 17/18 |
| | | | | 365/96 |

* cited by examiner

LOW VOLTAGE ONE-TIME-PROGRAMMABLE MEMORY AND ARRAY THEREOF

RELATED APPLICATIONS

This application claims priority to Taiwan Application Serial Number 111115503, filed Apr. 22, 2022, which is herein incorporated by reference.

BACKGROUND

Technical Field

The present disclosure relates to a one-time-programmable memory and an array thereof. More particularly, the present disclosure relates to a low voltage one-time-programmable memory and an array thereof.

Description of Related Art

The conventional one-time-programmable (OTP) memory includes an e-Fuse memory and an anti-fuse memory. Both of the memory device of the e-Fuse memory and the anti-fuse memory should be programmable by a high voltage. Thus, the OTP memory should be equipped with a low-voltage core transistor and a high-voltage I/O transistor.

By the miniature of the semiconductor process, developing a low voltage one-time-programmable memory and an array thereof with less electronic component, simplified circuit and small volume are commercially desirable.

SUMMARY

According to one aspect of the present disclosure, a low voltage one-time-programmable memory includes a first conductive layer, a first via, a second conductive layer, a select transistor, a second via and a third conductive layer. The first via is electrically connected to the first conductive layer. The second conductive layer is electrically connected to the first via. The select transistor is electrically connected to the second conductive layer. The second via is electrically connected to the second conductive layer. The third conductive layer is electrically connected to the second via. A first current passed through the second via is a sum of a second current passed through the first via and a third current passed through the select transistor.

According to another aspect of the present disclosure, a low voltage one-time-programmable memory array includes a plurality of low voltage one-time-programmable memories. Each of the low voltage one-time-programmable memories includes a first conductive layer, a first via, a second conductive layer, a select transistor, a second via and a third conductive layer. The first via is electrically connected to the first conductive layer. The second conductive layer is electrically connected to the first via. The select transistor is electrically connected to the second conductive layer. The select transistor includes a source electrode, a drain electrode and a gate electrode. The source electrode is connected to the second conductive layer. The second via is electrically connected to the second conductive layer. The third conductive layer is electrically connected to the second via. The low voltage one-time-programmable memories are arranged in an array. The gate electrode of the select transistor of each of the low voltage one-time-programmable memories arranged along a longitudinal direction is electrically connected to a word line. The second via of each of the low voltage one-time-programmable memories arranged along the longitudinal direction is electrically connected to a source line. The drain electrode of the select transistor of each of the low voltage one-time-programmable memories arranged along a horizontal direction is electrically connected to a bit line. The first via of each of the low voltage one-time-programmable memories arranged along the horizontal direction is electrically connected to a current divider control line. A first current passed through the second via is a sum of a second current passed through the first via and a third current passed through the select transistor.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details are unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
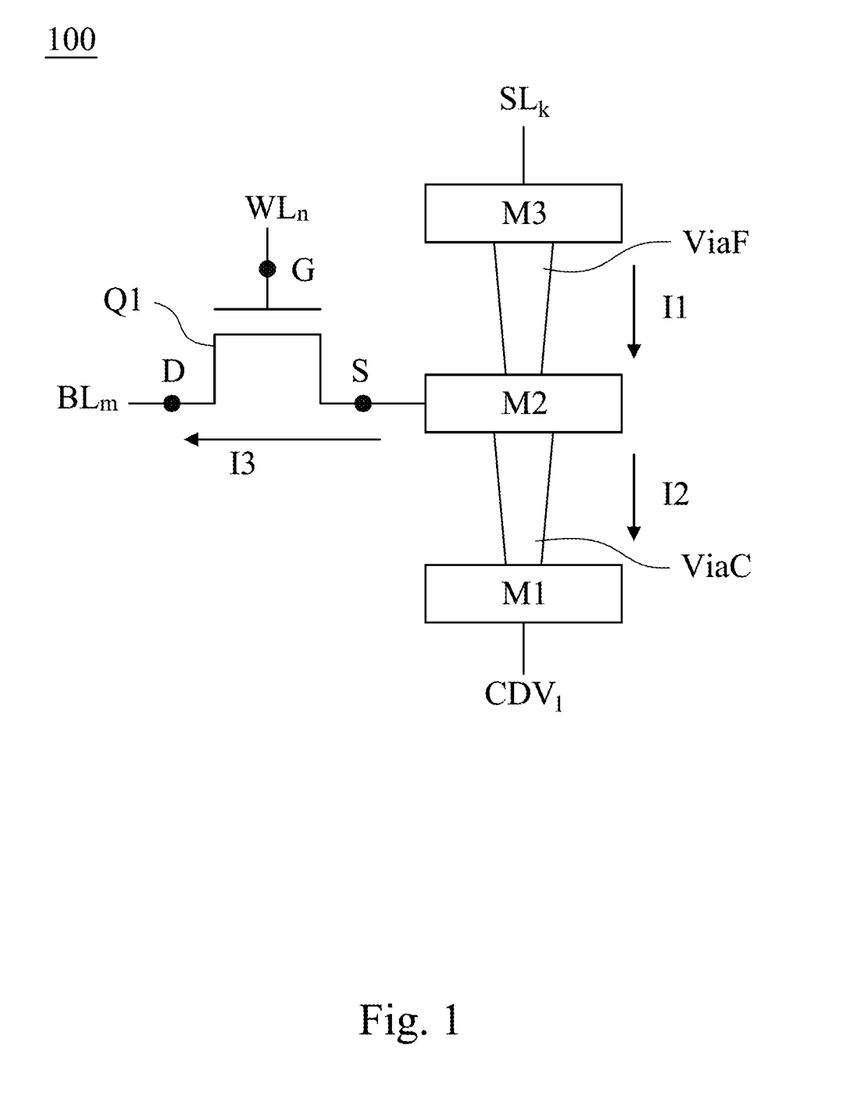
FIG. 1 shows a schematic view of a low voltage one-time-programmable memory according to a first embodiment of the present disclosure.

Please refer to FIG. 1, FIG. 1 shows a schematic view of a low voltage one-time-programmable memory 100 according to a first embodiment of the present disclosure. The low voltage one-time-programmable memory 100 includes a first conductive layer M1, a first via ViaC, a second conductive layer M2, a select transistor Q1, a second via ViaF and a third conductive layer M3. The first via ViaC is electrically connected to the first conductive layer M1. The second conductive layer M2 is electrically connected to the first via ViaC. The select transistor Q1 is electrically connected to the second conductive layer M2. The second via ViaF is electrically connected to the second conductive layer M2. The third conductive layer M3 is electrically connected to the second via ViaF.

A first current I1 passed through the second via ViaF is a sum of a second current I2 passed through the first via ViaC and a third current I3 passed through the select transistor Q1.

In detail, the select transistor Q1 can include a source electrode S, a drain electrode D and a gate electrode G. An end of the first via ViaC is connected to the first conductive layer M1, and the other end of the first via ViaC is connected to the second conductive layer M2. An end of the second via ViaF is connected to the third conductive layer M3, and the other end of the second ViaF is connected to the second conductive layer M2. One of the source electrode S and the drain electrode D is connected to the second conductive layer M2, and another of the source electrode S and the drain electrode D is connected to the bit line $BL_m$. In the embodiment of FIG. 1, the second via ViaF can be electrically connected to a source line $SL_k$ via the third conductive layer M3. The gate electrode G of the select transistor Q1 can be electrically connected to a word line $WL_n$. The source electrode S is connected to the second conductive layer M2. The drain electrode D is connected to the bit line $BL_m$, but the present disclosure is not limited thereto. The first via ViaC is electrically connected to a current divider control line $CDV_l$.

Figure 2:
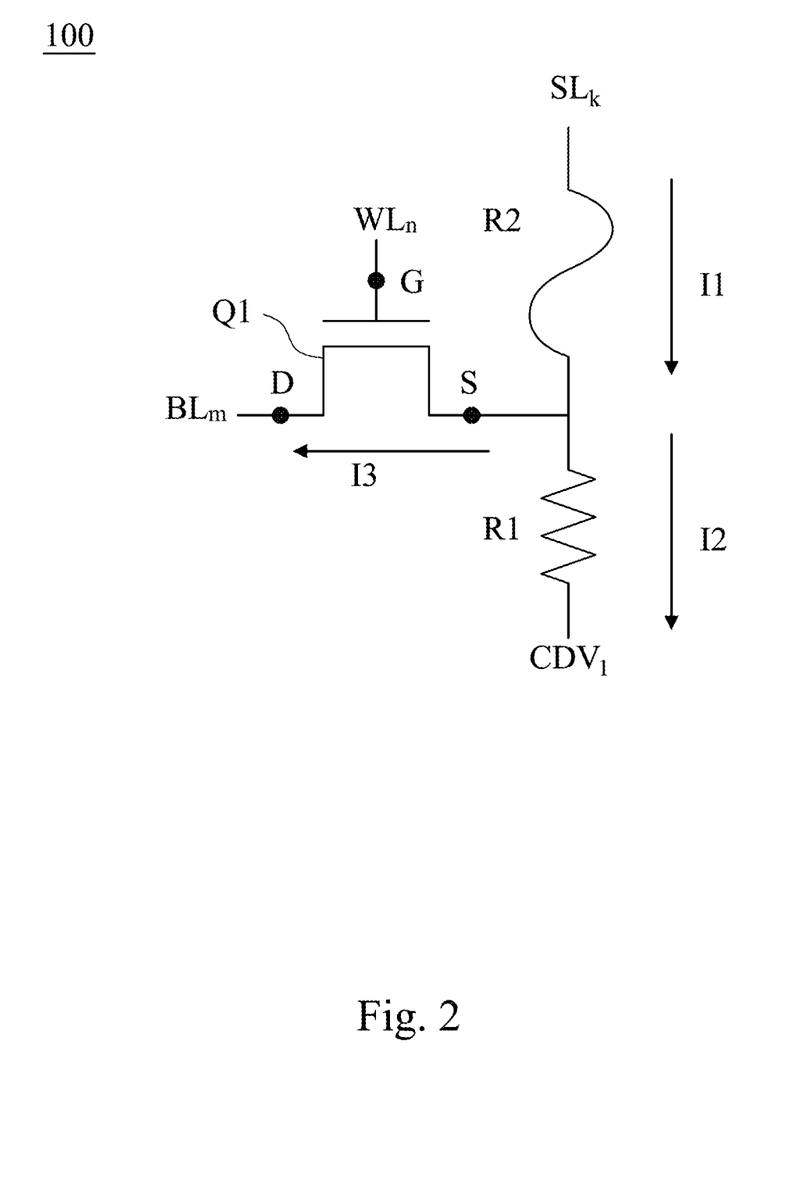
FIG. 2 shows an equivalent circuit diagram of the low voltage one-time-programmable memory in FIG. 1.

Please refer to FIG. 1 and FIG. 2, FIG. 2 shows an equivalent circuit diagram of the low voltage one-time-programmable memory 100 in FIG. 1. The first via ViaC can be one of a resistor, a capacitor, a Metal-Oxide-Semiconductor Field-Effect Transistor (MOSFET), or other electronic components, but the present disclosure is not limited thereto. In the embodiment of FIG. 2, the first via ViaC (dividing via) can be equivalent to a resistor R1. The second via ViaF (fuse via) can be equivalent to an e-Fuse R2 (electronic fuse), and the select transistor Q1 can be a Fin Field-Effect Transistor (FinFET). The source line $SL_k$ is configured to input a program voltage to the second via ViaF, and the program voltage is greater than or equal to 0.5 V, and less than 2 V.

Moreover, when the first current I1 passed through the e-Fuse R2 is less than a current which can fuse the e-Fuse R2, the first via ViaC and the second via ViaF are in a short-circuit state. When the first current I1 passed through the e-Fuse R2 is greater than or equal to the current which can fuse the e-Fuse R2, the e-Fuse R2 is in an open-circuit state, and the resistor R1 is maintained in the short-circuit state. The first current I1 passed through the e-Fuse R2 is divided and flowed into the resistor R1 and the select transistor Q1. The first via ViaC, which can divide the current, is added to an e-Fuse memory structure to avoid an excessive current value of the third current I3 passed through the select transistor Q1, therefore, the low-voltage core transistors of the low voltage one-time-programmable memory 100 of the present disclosure can be driven by a low voltage between 0.5 V and 2 V to execute one-time-programming.

Figure 3:
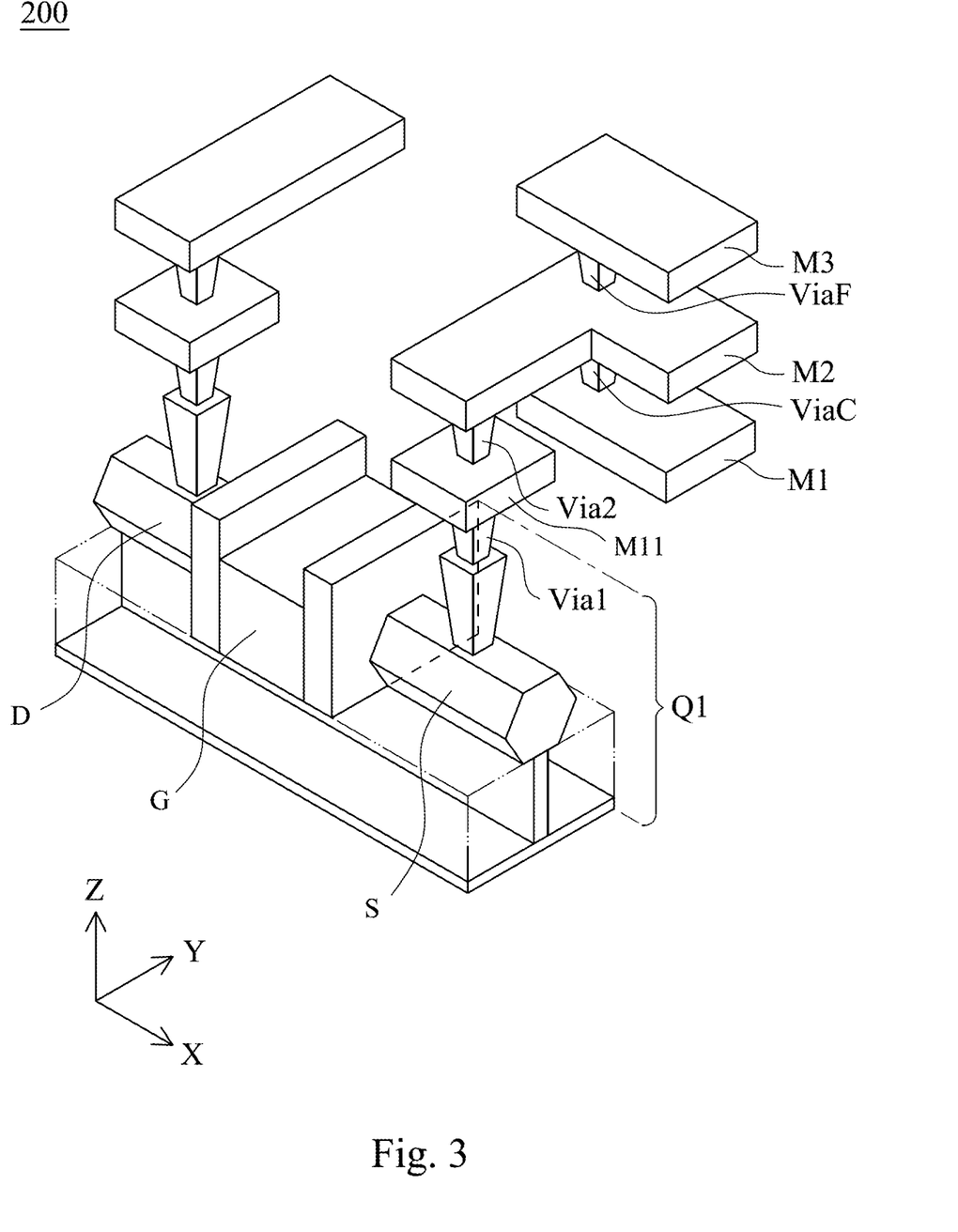
FIG. 3 shows a three-dimensional schematic view of a low voltage one-time-programmable memory according to a second embodiment of the present disclosure.
Figure 4:
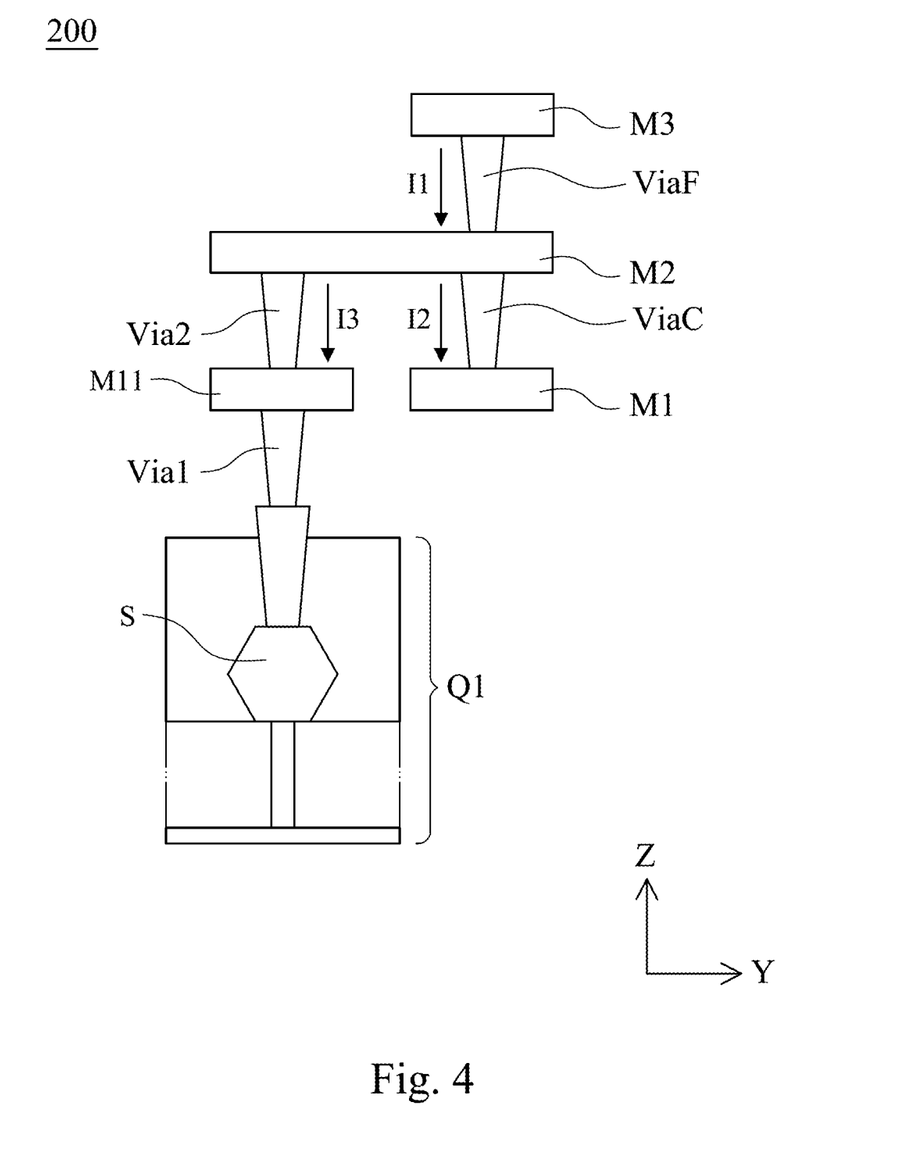
FIG. 4 shows a side view of the low voltage one-time-programmable memory in FIG. 3.

Please refer to FIG. 3 and FIG. 4, FIG. 3 shows a three-dimensional schematic view of a low voltage one-time-programmable memory 200 according to a second embodiment of the present disclosure. FIG. 4 shows a side view of the low voltage one-time-programmable memory 200 in FIG. 3. FIG. 4 shows the low voltage one-time-programmable memory 200 viewed along an axial X. The low voltage one-time-programmable memory 200 includes a first conductive layer M1, a first via ViaC, a second conductive layer M2, a select transistor Q1, a second via ViaF and a third conductive layer M3. The first conductive layer M1, the first via ViaC, the second conductive layer M2, the second via ViaF and the third conductive layer M3 are the same as the first conductive layer M1, the first via ViaC, the second conductive layer M2, the second via ViaF and the third conductive layer M3 in FIG. 1, respectively, and will not be described again. Furthermore, the select transistor Q1 of the low voltage one-time-programmable memory 200 is electrically connected to the second conductive layer M2 via another first conductive layer M11. The second current I2 passes through the first conductive layer M1. The third current I3 passes through the another first conductive layer M11.

In FIG. 4, the select transistor Q1 is electrically connected to the second conductive layer M2 via a via Via1, the another first conductive layer M11 and a via Via2 in sequence. A gap is formed between the first conductive layer M1 and the another first conductive layer M11 along an axial Y. Thus, when a program voltage is applied on the third conductive layer M3, a first current I1 passes through the second via ViaF and is divided into the second current I2 and the third current I3 at the second conductive layer M2. The second current I2 flows to the first via ViaC and the first conductive layer M1. The third current I3 flows to the via Via2, the another first conductive layer M11, the via Via1 and the source electrode S of the select transistor Q1 along an axial Z in sequence. Thus, the low voltage one-time-programmable memory 200 of the present disclosure can be driven by the low-voltage core transistor, reduce the amount of the electronic components, and reduce the volume by removing the high-voltage I/O transistors in the conventional one-time-programmable memory.

Furthermore, a width of one of the first via ViaC and the second via ViaF is less than a width of one of the first conductive layer M1, the second conductive layer M2 and the third conductive layer M3. In the embodiment of FIG. 3, the width (defined along the axial Y) of the first conductive layer M1 is the same as the width of the third conductive layer M3. The width of the second via ViaF is the same as the width of the first via ViaC, and the width of each of the second via ViaF and the first via ViaC is less than the width of each of the first conductive layer M1, the second conductive layer M2 and the third conductive layer M3, but the present disclosure is not limited thereto.

Figure 5:
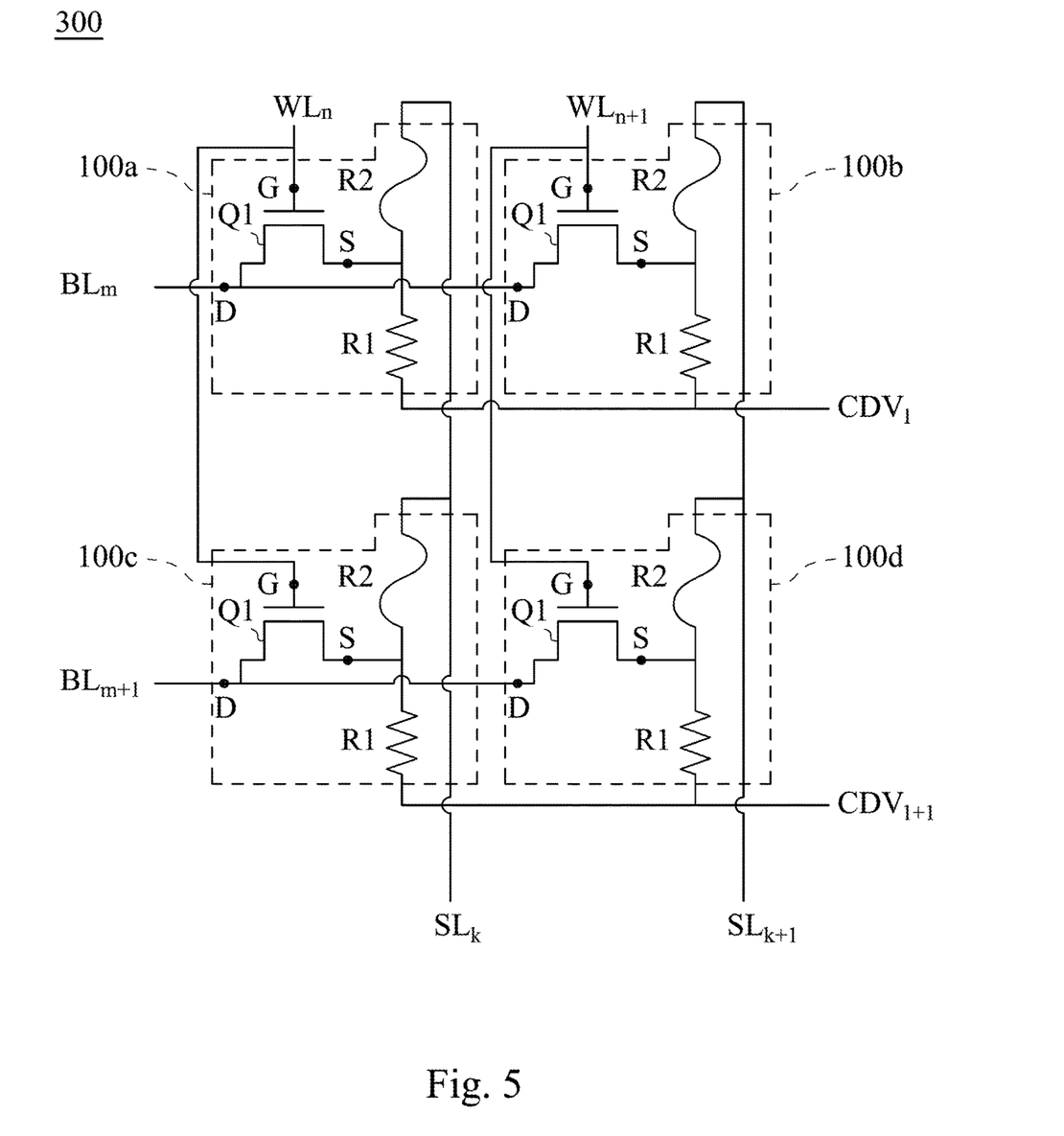
FIG. 5 shows an equivalent circuit diagram of a low voltage one-time-programmable memory array according to a third embodiment of the present disclosure.

Please refer to FIG. 1, FIG. 2 and FIG. 5, FIG. 5 shows an equivalent circuit diagram of a low voltage one-time-programmable memory array 300 according to a third embodiment of the present disclosure. The low voltage one-time-programmable memory array 300 includes a plurality of low voltage one-time-programmable memories 100a, 100b, 100c, 100d. The structure of each of the low voltage one-time-programmable memories 100a, 100b, 100c, 100d is the same as the structure of the low voltage one-time-programmable memory 100 in FIG. 1, and will not be described again. The low voltage one-time-programmable memories 100a, 100b, 100c, 100d are arranged in an array. The gate electrode G of the select transistor Q1 of each of the low voltage one-time-programmable memories 100a, 100b, 100c, 100d arranged along a longitudinal direction is electrically connected to the word lines $WL_n$, $WL_{n+1}$. The second via ViaF of each of the low voltage one-time-programmable memories 100a, 100b, 100c, 100d arranged along the longitudinal direction is electrically connected to the source lines $SL_k$, $SL_{k+1}$. The drain electrode D of the select transistor Q1 of each of the low voltage one-time-programmable memories 100a, 100b, 100c, 100d arranged along a horizontal direction is electrically connected to the bit lines $BL_m$, $BL_{m+1}$. The first via ViaC of each of the low voltage one-time-programmable memories 100a, 100b, 100c, 100d arranged along the horizontal direction is electrically connected to the current divider control lines $CDV_l$, $CDV_{l+1}$. The first current I1 passed through the second via ViaF is a sum of the second current I2 passed through the first via ViaC and the third current I3 passed through the select transistor Q1.

In the embodiment of FIG. 5, the low voltage one-time-programmable memories 100a, 100b, 100c, 100d are arranged in a 2×2 array, but the present disclosure is not limited thereto. The gate electrode G of the low voltage one-time-programmable memory 100a is electrically connected to the word line $WL_n$. The drain electrode D is electrically connected to the bit line $BL_m$. The e-Fuse R2 is electrically connected to the source line $SL_k$. The resistor R1 is electrically connected to the current divider control line $CDV_l$.

The gate electrode G of the low voltage one-time-programmable memory 100b is electrically connected to the word line $WL_{n+1}$. The drain electrode D is electrically connected to the bit line $BL_m$. The e-Fuse R2 is electrically connected to the source line $SL_{k+1}$. The resistor R1 is electrically connected to the current divider control line $CDV_l$.

The gate electrode G of the low voltage one-time-programmable memory 100c is electrically connected to the word line $WL_n$. The drain electrode D is electrically connected to the bit line $BL_{m+1}$. The e-Fuse R2 is electrically connected to the source line $SL_k$. The resistor R1 is electrically connected to the current divider control line $CDV_{l+1}$.

The gate electrode G of the low voltage one-time-programmable memory 100d is electrically connected to the word line $WL_{n+1}$. The drain electrode D is electrically connected to the bit line $BL_{m+1}$. The e-Fuse R2 is electrically connected to the source line $SL_{k+1}$. The resistor R1 is electrically connected to the current divider control line $CDV_{l+1}$.

In detail, the low voltage one-time-programmable memory array 300 can be read and programmed by the voltages of the word lines $WL_n$, $WL_{n+1}$, the bit lines $BL_m$, $BL_{m+1}$, the source lines $SL_k$, $SL_{k+1}$ and the current divider control lines $CDV_l$, $CDV_{l+1}$. Table 1 lists the voltages of the aforementioned lines while the low voltage one-time-programmable memory array 300 is selected to program (write) or read one of the low voltage one-time-programmable memories 100a, 100b, 100c, 100d. Vpro represents a programing voltage value, Vread represents a read voltage value, and VDD represents a voltage value connected to the drain electrode D of the select transistor Q1.

TABLE 1

| | program | | read | |
|---|---|---|---|---|
| | select | unselect | select | unselect |
| word lines $WL_n$ ` $WL_{n+1}$ | VDD | 0 | VDD | 0 |
| bit lines $BL_m$ ` $BL_{m+1}$ | 0 | floating | Vread | floating |
| source lines $SL_k$ ` $SL_{k+1}$ | Vpro | floating | 0 | floating |
| current divider control lines $CDV_l$ ` $CDV_{l+1}$ | 0 | Vpro | Vread | floating |

Thus, the select transistors Q1 of the low voltage one-time-programmable memory array 300 of the present disclosure can be driven by a low voltage between 0.5 V and 2 V to read and program without high-voltage I/O transistors.

According to the aforementioned embodiments and examples, the advantages of the present disclosure are described as follows.

1. The first via, which can divide the current, is added to an e-Fuse memory structure to avoid an excessive current value of the third current passed through the select transistor, therefore, the low-voltage core transistors of the low voltage one-time-programmable memory of the present disclosure can be driven by a low voltage between 0.5 V and 2 V to execute one-time-programming.

2. The low voltage one-time-programmable memory of the present disclosure can be driven by the low-voltage core transistor, reduce the amount of the electronic components, and reduce the volume by removing the high-voltage I/O transistors in the conventional one-time-programmable memory.

3. The select transistors of the low voltage one-time-programmable memory array of the present disclosure can be driven by a low voltage between 0.5 V and 2 V to read and program without high-voltage I/O transistors.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A low voltage one-time-programmable memory, comprising:
   a first conductive layer;
   a first via electrically connected to the first conductive layer;
   a second conductive layer electrically connected to the first via;
   a select transistor electrically connected to the second conductive layer;
   a second via electrically connected to the second conductive layer; and
   a third conductive layer electrically connected to the second via;
   wherein a first current passed through the second via is a sum of a second current passed through the first via and a third current passed through the select transistor.

2. The low voltage one-time-programmable memory of claim 1, wherein the select transistor is electrically connected to the second conductive layer via another first conductive layer, the second current passes through the first conductive layer, and the third current passes through the another first conductive layer.

3. The low voltage one-time-programmable memory of claim 1, wherein the first via is one of a resistor, a capacitor and a Metal-Oxide-Semiconductor Field-Effect Transistor (MOSFET).

4. The low voltage one-time-programmable memory of claim 1, wherein the select transistor is a Fin Field-Effect Transistor (FinFET).

5. The low voltage one-time-programmable memory of claim 1, wherein the select transistor comprises a source electrode, a drain electrode and a gate electrode, and one of the source electrode and the drain electrode is connected to the second conductive layer.

6. The low voltage one-time-programmable memory of claim 5, wherein the second via is electrically connected to a source line, the gate electrode of the select transistor is electrically connected to a word line, another one of the source electrode and the drain electrode is electrically connected to a bit line, and the first via is electrically connected to a current divider control line.

7. The low voltage one-time-programmable memory of claim 6, wherein the source line is configured to input a program voltage to the second via, the program voltage is greater than or equal to 0.5 V, and less than 2 V.

8. The low voltage one-time-programmable memory of claim 1, wherein a width of one of the first via and the second via is less than a width of one of the first conductive layer, the second conductive layer and the third conductive layer.

9. A low voltage one-time-programmable memory array comprising:
- a plurality of low voltage one-time-programmable memories, each of the low voltage one-time-programmable memories comprising:
  - a first conductive layer;
  - a first via electrically connected to the first conductive layer;
  - a second conductive layer electrically connected to the first via;
  - a select transistor electrically connected to the second conductive layer, wherein the select transistor comprises a source electrode, a drain electrode and a gate electrode, and the source electrode is connected to the second conductive layer;
  - a second via electrically connected to the second conductive layer; and
  - a third conductive layer electrically connected to the second via;
- wherein the low voltage one-time-programmable memories are arranged in an array, the gate electrode of the select transistor of each of the low voltage one-time-programmable memories arranged along a longitudinal direction is electrically connected to a word line, the second via of each of the low voltage one-time-programmable memories arranged along the longitudinal direction is electrically connected to a source line, the drain electrode of the select transistor of each of the low voltage one-time-programmable memories arranged along a horizontal direction is electrically connected to a bit line, and the first via of each of the low voltage one-time-programmable memories arranged along the horizontal direction is electrically connected to a current divider control line;
- wherein a first current passed through the second via is a sum of a second current passed through the first via and a third current passed through the select transistor.

10. The low voltage one-time-programmable memory array of claim 9, wherein the source line is configured to input a program voltage to the second via of each of the low voltage one-time-programmable memories, the program voltage is greater than or equal to 0.5 V, and less than 2 V.

* * * * *